(12) United States Patent
Gordon

(10) Patent No.: US 6,618,281 B1
(45) Date of Patent: Sep. 9, 2003

(54) CONTENT ADDRESSABLE MEMORY (CAM) WITH ERROR CHECKING AND CORRECTION (ECC) CAPABILITY

(75) Inventor: Tarl S. Gordon, Leander, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/146,154

(22) Filed: May 15, 2002

(51) Int. Cl.$^7$ .............................................. G11C 15/00
(52) U.S. Cl. ..................... 365/49; 365/189.07
(58) Field of Search .............................. 365/49, 189.07, 365/154, 156; 711/108

(56) References Cited

U.S. PATENT DOCUMENTS

| | | | |
|---|---|---|---|
| 4,486,739 A | 12/1984 | Franaszek et al. | ... 340/347 DD |
| 5,978,414 A | 11/1999 | Nara | ............ 375/225 |
| 6,101,116 A | 8/2000 | Lien et al. | ............ 365/49 |
| 6,430,073 B1 * | 8/2002 | Batson et al. | ............ 365/49 |
| 6,512,685 B1 * | 1/2003 | Lien et al. | ............ 365/49 |

OTHER PUBLICATIONS

"ECC Algorithm (Error Checking & Correction)," Memory Product & Technology Division, Samsung Electronics, Aug. 30, 1997.
Richard E. Blahut, *Theory and Practice of Error Control Codes*, May 1984, pp. 45–64, 112–129, and 131–228.

* cited by examiner

*Primary Examiner*—Son Mai
(74) *Attorney, Agent, or Firm*—Robert A. Walsh; Cantor Colburn LLP

(57) ABSTRACT

A content addressable memory (CAM) and method capable of ignoring and correcting bit errors contained therein is disclosed. In an exemplary embodiment, the CAM includes a plurality of individual CAM cells for storing a codeword having a number of bits associated therewith. A match line is coupled to each of the plurality of individual CAM cells, and is used to indicate a match status of a comparand word that is compared to the stored codeword. The match status is reflective of either a match state or a mismatch state. A sensing apparatus is used for latching the match line to the match state whenever the comparand word mismatches the stored codeword by a number of N or fewer bits, wherein N is defined a maximum number of correctable bits for a given ECC algorithm used.

44 Claims, 3 Drawing Sheets

CONTENT ADDRESSABLE MEMORY (CAM) WITH ERROR CHECKING AND CORRECTION (ECC) CAPABILITY

BACKGROUND

The present invention relates generally to integrated circuit memory devices and, more particularly, to a content addressable memory capable of detecting and correcting bit errors contained therein when used in conjunction with error checking and correction techniques.

A content addressable memory (CAM) is a storage device in which storage locations are identified by their contents, not by names or positions. A search argument is presented to the CAM and the location that matches the argument asserts a corresponding match line. One use for such a memory is in dynamically translating logical addresses to physical addresses in a virtual memory system. In this case, the logical address is the search argument and the physical address is produced as a result of the dynamic match line selecting the physical address from a storage location in a random access memory (RAM). CAMs are also frequently used for Internet address searching.

A CAM typically includes an array of CAM cells, where each row of the CAM array corresponds to a stored word. The CAM cells in a given row couple to a word line and a match line associated with the row. The word line connects to a control circuit that can either select the row for a read/write operation or bias the word line for a search. The match line carries a signal that, during a search, indicates whether the word stored in the row matches an applied input value. Each column of the conventional CAM array corresponds to the same bit position in all of the CAM words, while the CAM cells in a particular column are coupled to a pair of bit lines associated with the column. A search is applied to each pair of bit lines, which have a pair of complementary binary signals thereon that represent a bit of an input value. Each CAM cell changes the voltage on the associated match line if the CAM cell stores a bit that does not match the bit represented on the attached bit lines. Accordingly, if the voltage on a match line remains unchanged during a search, the word stored in that row of CAM cells matches the input word.

In conventional CAM systems, a detected mismatch condition is accepted as accurate, regardless of whether the mismatch results from an actual data mismatch or from a flipped cell(s) caused by a soft error. A soft error may occur as a result of phenomena such as impacts of cosmic rays or alpha particles, wherein the value of a binary bit of stored data is changed. Currently, some CAM arrays are designed to be refreshed periodically in order to fix any flipped cells. However, in so doing, a risk is taken in the meantime that some mismatches might actually be false mismatches.

Error checking and correction (ECC) algorithms have been used to address the problem of soft error. The most simple ECC algorithms provide the ability to correct a single bit error and detect a double bit error by reading and writing the original data along with a checksum data word. More complicated algorithms may correct more than a single bit errors and detect more than double bit errors by utilizing more checksum data bits. The data, along with the checksum, may be tested for validity and potentially corrected or otherwise marked as "uncorrectably corrupt". A significant characteristic of ECC encoded data is that no two combinations of data and checksum are two bits or less different.

It is desirable to be able to conduct CAM searches that recognize a single bit mismatch as a complete match. When such a CAM search is performed in conjunction with error checking and correction techniques, a one bit mismatch would be deemed "correctably corrupt" and thus attributed to soft error as opposed to a true one bit data mismatch. Existing CAM configurations, however, are not presently adapted to make this distinction.

BRIEF SUMMARY

The above discussed and other drawbacks and deficiencies of the prior art are overcome or alleviated by a content addressable memory (CAM) and method capable of detecting and correcting bit errors contained therein. In an exemplary embodiment, the CAM includes a plurality of individual CAM cells for storing a codeword having a number of bits associated therewith. A match line is coupled to each of the plurality of individual CAM cells, and is used to indicate a match status of a comparand word that is compared to the stored codeword. The match status is reflective of either a match state or a mismatch state. The CAM is designed to store a word of M plus N bits, wherein M is the number of bits in the data and N is the number of bits in the ECC checksum code. A sensing apparatus is used for latching the match line to the match state whenever the comparand word mismatches the stored codeword by a number of N or fewer bits.

In a preferred embodiment, the sensing apparatus also latches the match line to the mismatch state whenever the comparand word mismatches the stored codeword by more than N bits. The sensing apparatus further includes a reference match line which is discharged at a selected rate from a precharged state during a compare operation. During a compare operation, the sensing apparatus determines the match status by comparing the selected rate of discharge of the reference match line to a rate of discharge of the match line. If the selected rate of discharge of the reference match line is greater than the rate of discharge of the match line, then the match line is latched to the match state. However, if the rate of discharge of the match line is greater than the selected rate of discharge of the reference match line, then the match line is latched to the mismatch state.

In an alternative embodiment, the CAM cells are further adapted to correct any mismatching bits stored therein if the match line is latched to said match state. Each of the CAM cells further include a pair of cross coupled inverters configured as a data storage latch. A first access transistor selectively couples a bit line to a first node within the data storage latch, and a second access transistor selectively couples a complementary bit line to a second node within the data storage latch. The first node has a voltage value representing the value of the bit stored in the data storage latch, while the second node has a voltage value representing the complementary value of the bit stored in the data storage latch. A third access transistor selectively couples the first node to said match line, and a fourth access transistor selectively couples the second node to the match line.

If a comparand bit applied to a given CAM cell does not match a stored bit within the CAM cell, and if the match line is also latched to said match state, then the stored bit within the CAM cell is caused to be inverted. However, a matching stored bit within the CAM cell is prevented from being inverted by the match line if the match line is latched to the mismatch state.

BRIEF DESCRIPTION OF THE DRAWINGS

Referring to the exemplary drawings wherein like elements are numbered alike in the several Figures.

DETAILED DESCRIPTION

An apparatus and method is disclosed hereinafter, wherein the degree to which a search word is mismatched from the stored word in a CAM may be detected. Briefly stated, a single ended sensing apparatus is configured such that a distinction is made between a single bit mismatch (i.e., a soft error) and a two or more bit mismatch (i.e., an actual data mismatch) when the CAM is used in conjunction with ECC techniques. Moreover, when a correctable soft error condition is detected, the individual CAM cell(s) themselves are used to correct the soft error during a search operation. Thereby, cycle time may be saved in eliminating the need for refreshing already good data.

Figure 1:
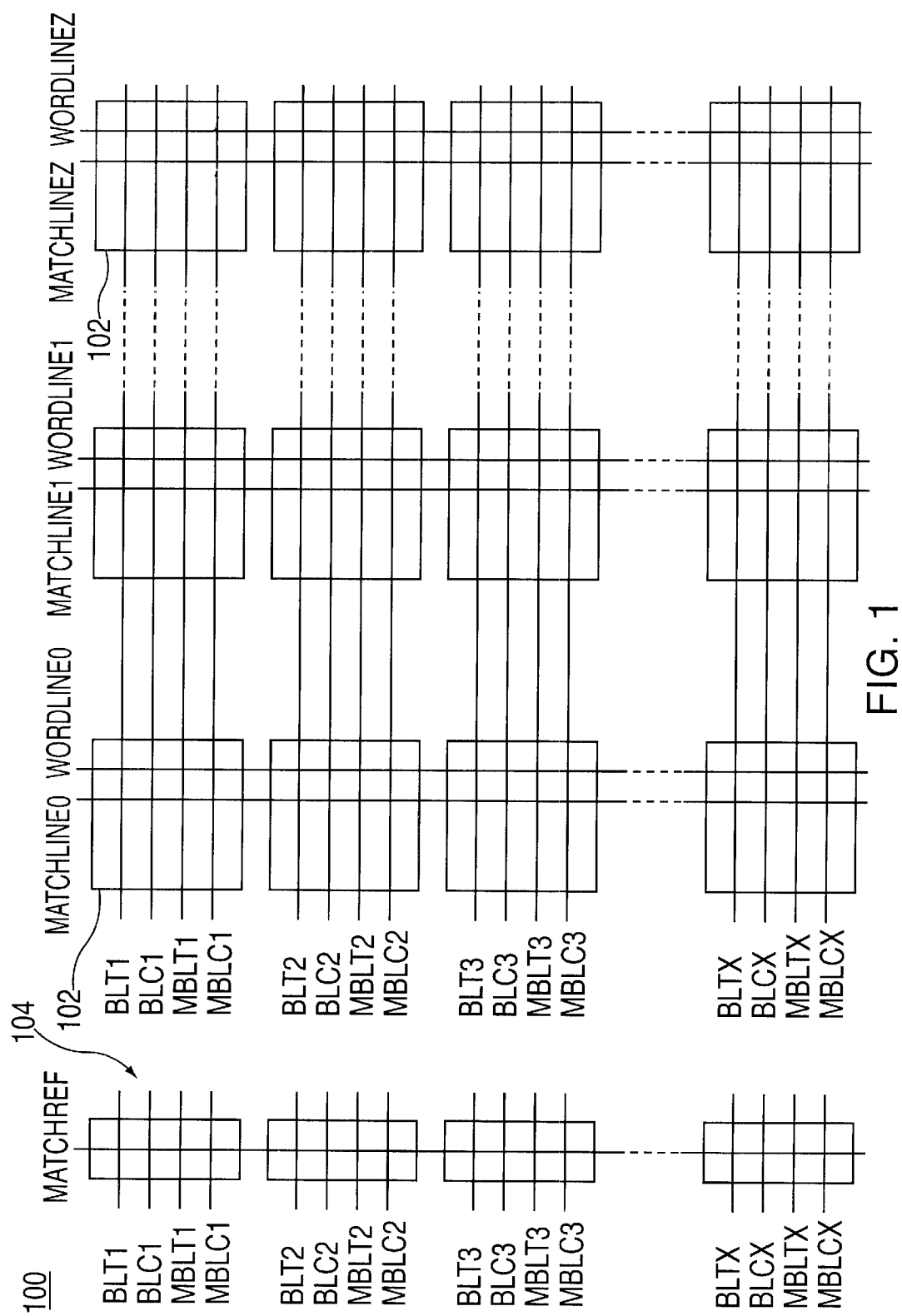
FIG. 1 is a schematic diagram of a content addressable memory (CAM) array, including a reference match line therein, configured for use in accordance with an embodiment of the invention.

Referring initially to FIG. 1, there is shown a CAM array 100 configured for use in accordance with an embodiment of the invention. CAM array 100 includes a plurality of CAM cells 102, arranged into rows and columns. Generally, each CAM cell 102 is coupled with a word line (individually designated WORDLINE 0–WORDLINE Z) and a match line (individually designated MATCHLINE 0–MATCHLINE Z), depending upon the particular row in which the cell is located. Each individual cell 102 further includes vertically oriented bit lines (BLT 1–BLT X) and the complements thereto (BLC 1–BLC X), as well as match bit lines (MBLT 1–MBLT X) and the complements thereto (MBLC 1–MBLC X). In some CAM designs, the bit line pairs (BLT, BLC) are used only for reading and writing operations, while the match bit line pairs (MBLT, MBLC) may be provided exclusively for compare operations. However, the match bit line pair may be omitted, with the compare operations being performed with the same bit line pair used for read and write operations.

In addition, there is also provided a reference match line (MATCHREF) within a dummy or reference word 104. As will be explained in greater detail later, MATCHREF is discharged from a precharged state (e.g., $V_{DD}$) to ground at a fixed rate during each compare operation. The specific rate of discharge of MATCHREF is preferably set such that it will discharge slightly faster than the match line having the largest acceptable number of mismatched bits thereon. Thus, for an "acceptable" one bit mismatch, MATCHREF will discharge at the rate of about a 1.5 bit mismatch. In other words, MATCHREF will discharge faster than the rate of MATCHLINE for a zero or a one bit mismatch, but slower for a two or more bit mismatch.

Although FIG. 1 illustrates the bit line pairs and match bit line pairs also included within the cells of the reference word 104, it will be understood that the reference word cells themselves do not participate in the functional operation of the CAM array 100. Conversely, the contents of the bit lines and match bit lines do not affect the operation of MATCHREF. However, MATCHREF is preferably similarly load(ed) in comparison to the other match lines, and preferably has a similar line capacitance as the other match lines.

Figure 2:
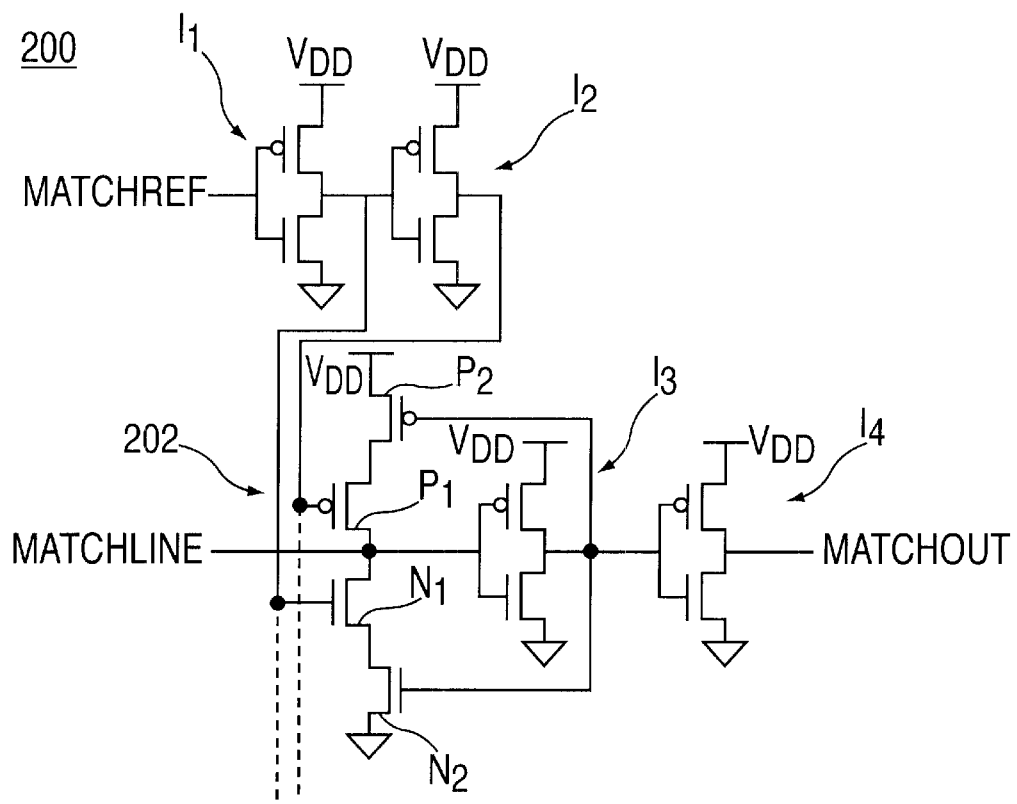
FIG. 2 is a schematic diagram of a sensing apparatus capable of detecting the difference between a mismatch condition indicative of a soft error (e.g., one bit mismatch) from a true mismatch condition (e.g., two or more bit mismatch), in accordance with an embodiment of the invention.

Referring now to FIG. 2, in accordance with an embodiment of the invention, there is illustrated a sensing apparatus 200 that detects a one bit mismatch condition and, in such a case, thereafter latches the corresponding match line: to the supply voltage. Conversely, if a more than one bit mismatch condition is detected, apparatus 200 will cause the corresponding match line to be driven to ground.

Apparatus 200 includes a pair of serially connected CMOS inverters I1 and I2 coupled to the reference match line, MATCHREF. The operation of an individual CMOS inverter, being well known in the art, is not discussed in further detail hereinafter. In addition, each match line in the CAM array 100 is further coupled to a transistor stack 202, as well as another pair of CMOS inverters I3 and I4. For ease of description, only one match line (designated in FIG. 2 simply as "MATCHLINE"), associated transistor stack 202, and pair of inverters I3 and I4 is shown. However, it will be understood that each match line in the CAM array includes the same circuit elements.

The input of inverter I1 is coupled directly to MATCHREF, while the output of I1 is connected to the input of inverter I2. In addition, the output of I1 is further connected to the gate of NFET N1 included within transistor stack 202, while the output of I2 is connected to the gate of PFET P1 included within transistor stack 202. Transistor stack 202 further includes a pull-up PFET P2, coupled to P1, as well as a pull-down NFET N2, coupled to N1. The gates of both P2 and N2 are connected to the output of inverter I3. The output of I3 is also connected to the input of inverter I4. As will later be appreciated, inverter I1 has the same switching characteristics as I3. In other words, the size of the individual PFETs and NFETs included within I1 and I3 are the same with respect to one another and preferably have the same switching voltages.

An understanding of the operation of sensing apparatus 200 is obtained through an analysis of the following possible conditions on a match line during a compare operation. Initially, the voltages on MATCHREF and MATCHLINE are biased or precharged to $V_{DD}$ (high) prior to a search operation. During this time, the output of I1 is low and thus NFET N1 is in a non-conductive state. Furthermore, the output of inverter I2 is high and thus PFET P1 is also in a non-conductive state. Since the voltage on MATCHLINE is initially precharged high, the output of inverter I3 is low and the output of inverter I4 (MATCHOUT) is high. Because the output of I3 is low, the pullup PFET P2 is set to a conductive state while the pulldown NFET N2 is in a non-conductive state. Then, during a compare operation, the voltage on MATCHREF will be discharged at a rate equivalent to about a 1.5 bit mismatch as described earlier. On the other hand, the status of the voltage on MATCHLINE will depend on how many (if any) bit mismatches are present on the CAM cells connected thereto.

One possibility is that if the comparand data applied to each CAM cell on MATCHLINE results in a complete match, meaning that none of the cells act to pull down the voltage thereon. Meanwhile, MATCHREF begins to discharge and the output of I1 eventually flips from high to low, while the output of I2 flips from low to high. As a result, both PFET P1 and NFET N1 are turned on. As soon as P1 and N1 are turned on, the voltage on MATCHLINE is held to the rail voltage ($V_{DD}$) since P2 remains on while N2 remains off. In other words, no change in voltage occurs on MATCHILINE in this case.

Another possibility is that there exists a two bit or more mismatch of the data in the cells on MATCHLINE. In this situation, the initial conditions are the same as described above. However, due to the two bit or more mismatch on MATCHLINE, the voltage thereon is pulled to ground. Moreover, the rate of discharge on MATCHLINE will exceed the rate of discharge on MATCHREF. The result is that the output of I3 will switch from high to low before the output of I1 switches from low to high (recalling that I1 is sized substantially identically to I3). Therefore, P2 is switched off and N2 is switched on before N1 and P1 are both switched on. Once N1 and P1 are finally turned on, the pulldown NFET N2 clamps MATCHLINE to ground. The output of I4 is held low, thereby indicating a mismatch.

Thirdly, there is the possibility of a one bit mismatch of the data in the cells of MATCHLINE. Again, with the use of ECC techniques, a one bit mismatch may be attributed to a soft error. In this case, the compare operation will still result in an initial discharge of the voltage on MATCHLINE. However, because there is only one CAM cell contributing to the discharge of MATCHLINE, the discharge rate is new slower than the discharge rate of MATCHREF (being set to discharge at a 1.5 bit mismatch rate). Put another way, the output of I1 will change from low to high (and the output of I2 will change from high to low) before the output of I3 has a chance to change from low to high. Thus, as the voltage on MATCHLINE begins to discharge from $V_{DD}$, P1 and N1 are turned on. This happens before P2 has a chance to be turned off and N2 has a chance to be turned on and, therefore, the combination of conductive PFETs P1 and P2 serve to pull the voltage on MATCHLINE back up to $V_{DD}$. The resulting output on MATCHOUT is high, thereby indicating a match condition despite the one bit cell mismatch.

It will be appreciated that the above described apparatus 200 more broadly allows for the determination of an N bit mismatch to result in a full match. Although in the example illustrated N is chosen to be 1, it should be understood that the present embodiments are applicable to any integral number N of bit mismatches so long as the reference match line (MATCHREF) is designed to be discharged at a the rate of an N.5 bit mismatch. Obviously, then, if it was desired (for example) to treat a three bit or fewer mismatch as a full match, then the MATCHREF circuitry would be designed so as to discharge the MATCHREF voltage at the rate of a 3.5 bit mismatch. That way, for a 1, 2 or 3 bit mismatch on the CAM word, the voltage on MATCHLINE would be clamped up to $V_{DD}$ after an initial dip. On the other hand, a 4 bit or more mismatch would result in the voltage on MATCHLINE being clamped to ground.

In addition to detecting a single bit mismatch in a CAM array with ECC encoding, it is also desirable to correct the soft error condition within the cell. Accordingly, the present invention embodiments further provide a means to flip (and thus correct) the single non-matching CAM cell when the MATCHLINE is clamped to the match condition ($V_{DD}$).

Figure 3:
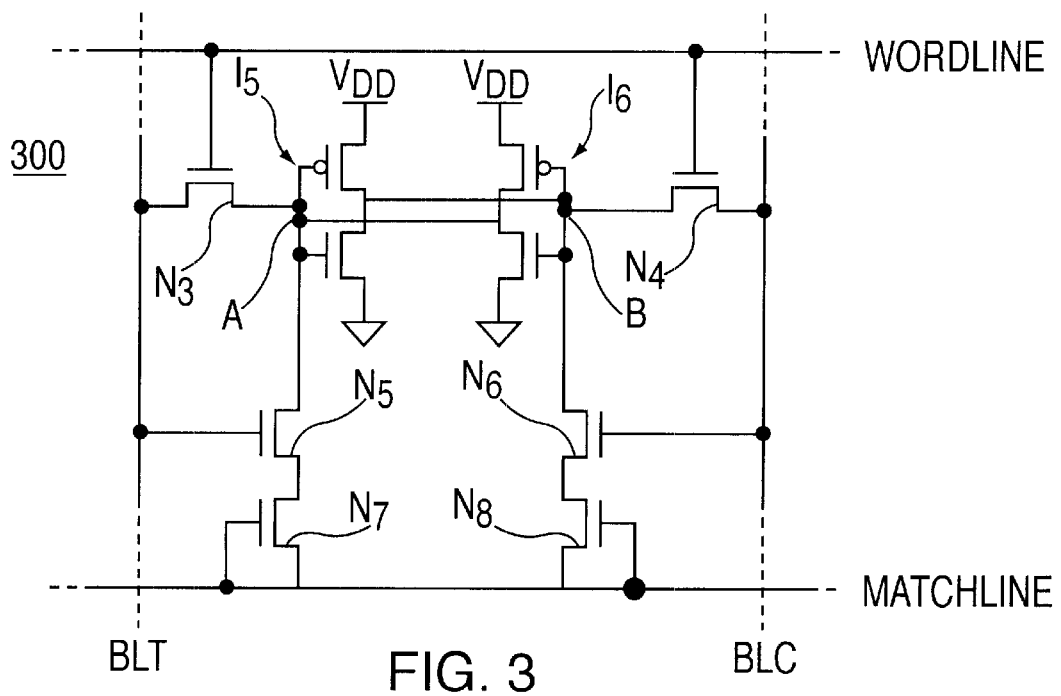
FIG. 3 is a schematic diagram of an exemplary CAM cell structure, configured to allow a mismatching bit attributable to soft error to be rewritten and corrected therein.

Referring now to FIG. 3, there is shown a modified CAM cell structure 300 for use in conjunction with the sensing apparatus 200. The cell structure 300 is configured such that a non matching bit stored therein is caused to be flipped when the corresponding match line is clamped up to the supply voltage, as described above. As is the case with a traditional SRAM based storage cell, CAM cell structure 300 includes a pair of cross coupled inverters, I5 and I6, which serve as the data storage element or latch. Access transistors N3 and N4 provide coupling from a pair of complementary bitlines BLT and BLC, respectively to the data storage latch for read and write operations. Data in the cell structure 300 is represented by stored voltage levels within the two sides of the bistable latch (I5 and I6) in opposite voltage configurations. That is, junction node A is high and junction node B is low when a logic "1" is stored, while junction node A is low and junction node B is high when a logic "0" is stored, thereby defining two stable states. Node B is thus the logical complement of node A.

To accomplish the soft error correction capability, the CAM cell structure 300 further includes NFET N5 having its gate connected to BLT, with the drain thereof connected to node A. NFET N6 has its gate connected to BLC, with the, drain thereof connected to node B. In addition, the source of N5 is connected to the drain of NFET N7 which, in turn, is configured as a diode by having both the gate and source terminals thereof coupled to MATCHLINE. Similarly, the source of N6 is connected to the drain of NFET N8. N8 is also configured as a diode, with both the gate and source thereof coupled to MATCHLINE as well. The process of correcting of a soft error in each CAM cell structure 300 may be compared to the operation of a traditional SRAM cell. Essentially, the search port on the CAM cell also acts as a write port by using the bit line pair BLT and BLC as word lines (or by using a dedicated match bit line pair MBLT and MBLC as illustrated in FIG. 1), and further using MATCHLINE as a write bit line.

Thus configured, CAM cell structure 300 will cause the data bit stored therein to be flipped during a search operation if MATCHLINE is driven to $V_{DD}$. By way of example, it will be assumed that cell 300 initially has a logic "1" stored therein, meaning the voltage at node A is high and the voltage at node B is low. When a mismatching search bit is presented to the cell (i.e., a logic "0" presented on BLT and a logic "1" presented on BLC), NFET N6 is rendered conductive while NFET N5 is off. Since MATCHLINE has been driven high by sensing apparatus 200, N8 (diode configuration) is also conductive. This causes the voltage at node B to be pulled from low up to high and, accordingly, cause the voltage at node A to be flipped from high to low, thereby correcting the soft error mismatch detected in cell 300. In contrast, if the compare operation had resulted in a two bit or more mismatch (i.e., MATCHLINE not being driven high), the voltage on MATCHLINE would simply be allowed to discharge through node B to ground through the NFET of I6.

The same principle applies when the cell 300 has a soft error logic "0" stored therein. If a compare "1" bit is then applied to BLT (and a complementary compare "0" bit applied to BLC), with MATCHLINE being driven and held high by the one bit mismatch condition, then NFET N5 is rendered conductive while N6 remains off. As N7 (diode configuration) is also conductive, the voltage at node A is changed from low to high, and the voltage at node B is changed from high to low.

By using NFETs N7 and N8 in a diode configuration, a particular matching CAM cell may be prevented from flipping in the event of a strong mismatch. Recalling that MATCHLINE is pulled to ground during a two bit or more mismatch, a matching CAM cell would otherwise be caused to flip without the presence of N7 and N8. Accordingly, whenever MATCHLINE is pulled to ground, both N7 and N8 are rendered nonconductive, thereby preventing the voltage on MATCHLINE from flipping a matching cell.

Figure 4:
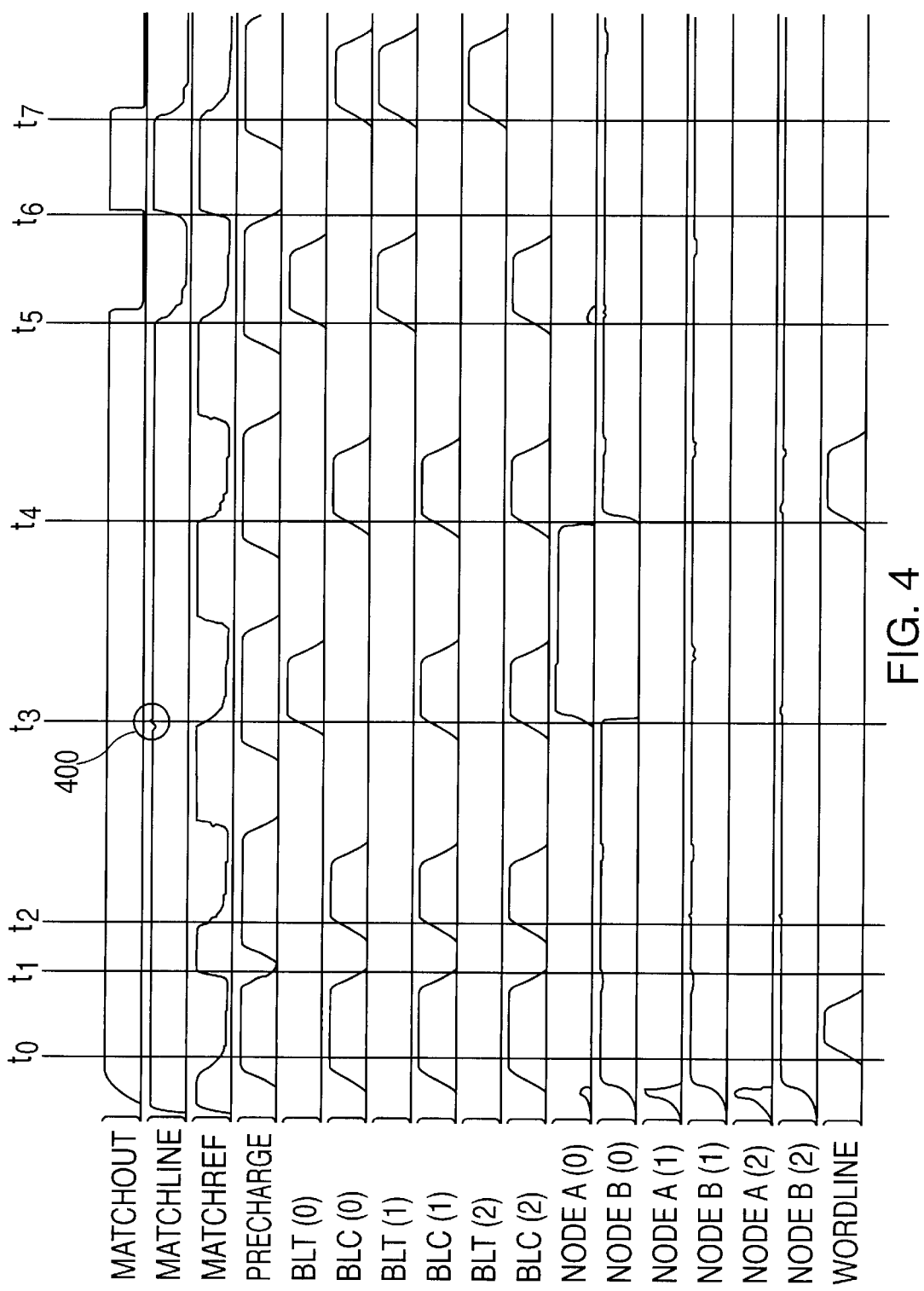
FIG. 4 is a waveform timing diagram illustrating the interaction between the sensing apparatus and the CAM cell structure, during a series of test compare operations for the CAM array.

Finally, the interaction between sensing apparatus 200 and CAM cell structure 300 is further illustrated by the signal timing diagram of FIG. 4. In this example, the voltage values of four individual CAM cells in a 14-bit word (having both data bits and ECC checksum bits) are analyzed, in addition to the associated match line, reference match line and other reference voltages. The specific waveforms as labeled in FIG. 4 correspond to the following voltage values:

| | |
|---|---|
| MATCHOUT- | voltage on MATCHOUT |
| MATCHLINE- | voltage on MATCHLINE |
| MATCHREF- | voltage on MATCHREF |
| PRECHARGE- | voltage on a precharge circuit (not shown) |
| BLT(0)- | voltage on the bit line of cell 0 |
| BLC(0)- | voltage on the complementary bit line of cell 0 |
| BLT(1)- | voltage on the bit line of cell 1 |
| BLC(1)- | voltage on the complementary bit line of cell 1 |
| BLT(2)- | voltage on the bit line of cell 2 |
| BLC(2)- | voltage on the complementary bit line of cell 2 |
| NODE A(0)- | voltage stored in cell 0 |
| NODE B(0)- | complementary voltage stored in cell 0 |
| NODE A(1)- | voltage stored in cell 1 |
| NODE B(1)- | complementary voltage stored in cell 1 |
| NODE A(2)- | voltage stored in cell 2 |
| NODE B(2)- | complementary voltage stored in cell 2 |
| WORDLINE- | voltage on WORDLINE |

Beginning at a time to, each cell is initialized with a known value upon the triggering of a pulse on WORDLINE. As shown in the diagram, the stored cell value for each the four cells (at NODE A) is a logic "0", or low. Naturally, the complements thereof are set at logic "1", or high. At time $t_1$, both MATCHREF and MATCHLINE are precharged high by the falling edge of a precharge signal (PRECHARGE), which is generated by an active low precharging circuit (not shown). The operation of precharging circuitry is well known in the art and is not discussed in further detail hereinafter.

A first compare operation is then commenced at time $t_2$, as indicated by the falling voltage of MATCHREF. For the first compare operation, a complete match condition is tested. Because each of the cells were initialized with a "0" bit therein, the true comparand bits applied to each cell bit line are also "0", as reflected by the low voltages on BLT(0), BLT(1) and BLT(2), and the high voltages on BLC(0), BLC(1) and BLC(2). Again, for purposes of simplicity, the bit line and complementary bit line voltages for only three cells are shown in this example. As described earlier, a complete match of all bits results in the both the MATCHLINE and MATCHOUT voltages remaining high, and is reflected as such in the diagram. Furthermore, there is no change in the status of the stored bits in cells 0–2, as is also expected.

Proceeding forward to time $t_3$, a second compare operation is performed. This time, the one bit match condition (i.e., a soft error condition) is tested. Specifically, the comparand bit applied to the bit line of cell 0 is a "1" bit, as reflected in voltage waveforms BLT(0) and BLC(0). Several conditions are noted immediately following $t_3$. First, the voltage on MATCHLINE is high as it is clamped to $V_{DD}$ by virtue of the operation of the sensing apparatus 200 described earlier. It will be recalled that a one bit mismatch results in MATCHLINE initially discharging at a rate slower than MATCHREF. Because of this, the MATCHLINE voltage is immediately pulled back up to the full value of $V_{DD}$. Graphically, this is illustrated (in circled area 400 of FIG. 4) by the slight dip in MATCHLINE before a quick return to $V_{DD}$. In additon, it is noted that the voltage on MATCHOUT remains high, reflecting that the one bit mismatch is still considered a full data match. Thirdly, it will be noted that, in addition to detecting the one bit mismatch condition, the "soft error" in cell 0 has been successfully corrected, as a "1" bit is now written therein. This can be seen by inspection of the flipping of the voltage waveforms of NODE A(0) and NODE B(0).

At time $t_4$, WORDLINE is again energized in order to rewrite the initial cell conditions back into the CAM word. In other words, the data within cell 0 is restored to a "0" bit for further compare testing. The next condition tested is a two bit mismatch, which is applied at time $t_5$. As can be seen, the comparand bits applied to cell 0 and cell 1 are both "1". Since there are now two mismatched cells, the rate of discharge of MATCHLINE now exceeds the rate of discharge of MATCHREF, as is illustrated by their respective waveforms. It will be recalled that this condition results in MATCHLINE being latched to ground, and thus MATCHOUT goes from high to low, signifying a true mismatch. The charge on MATCHLINE is dissipated to ground through N7, N5, and the NFET of I6 in cell 2. However, the integrity of the data in each cell (all remaining logic "0") of the word is still maintained in this mismatch condition.

At $t_6$, the voltages on MATCHREF, MATCHLINE and MATCHOUT are all returned to high by the falling edge of PRECHARGE. A final compare operation is then carried out at $t_7$, in which all but one bit (except for cell 0) is mismatching. This 13-bit mismatch condition was tested to further demonstrate that the combined (effect of several mismatching cells do not result in a rewrite to the lone matching cell, as would be the case without N7 and N8 configured as diodes to protect the cells. Furthermore, the voltages at each cell's internal nodes have remained intact.

Through the use of the sensing apparatus 200, along with the modified CAM cell configuration 300 as discussed above, a soft error may be detected and corrected within a CAM array when the data is deemed to be correctable corrupt. Although the embodiments have been described in terms of correcting a one bit mismatch, the disclosure may be adapted to correct more than one mismatching bit by adjusting the discharge time of the reference match line. Moreover, the addition of diode devices to CAM cell 300 allows a mismatching cell bit to be inverted during a latched match condition, while preventing matching bits from being inverted during a latched mismatch condition. In addition, the- principles of the invention embodiments are not limited to SRAM based CAM cells. For example, it is contemplated that the inventive principles could also be applied to a pair of DRAM based CAM cells (having a single transistor/capacitor storage elements) configured as a single storage cell.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A content addressable memory (CAM), comprising:
   a plurality of individual CAM cells for storing a codeword, said codeword having a number of bits associated therewith;
   a match line coupled to each of said plurality of individual CAM cells, said match line used to indicate a match status of a comparand word that is compared to said stored codeword, wherein said match status is reflective of either a match state or a mismatch state; and
   a sensing apparatus for latching said match line to said match state whenever said comparand word mismatches said stored codeword by a number of N or fewer bits.

2. The CAM of claim 1, wherein N=1.

3. The CAM of claim 1, wherein:
   said sensing apparatus further latches said match line to said mismatch state whenever said comparand word mismatches said stored codeword by more than N bits.

4. The CAM of claim 1, wherein said sensing apparatus further comprises:
   a reference match line, said reference match line being discharged at a selected rate from a precharged state during a compare operation;
   wherein, during said compare operation, said sensing apparatus determines said match status by comparing said selected rate of discharge of said reference match line to a rate of discharge of said match line.

5. The CAM of claim 4, wherein:
   if said selected rate of discharge of said reference match line is greater than said rate of discharge of said match line, then said match line is latched to said match state; and
   if said rate of discharge of said match line is greater than said selected rate of discharge of said reference match line, then said match line is latched to said mismatch state.

6. The CAM of claim 5, wherein said sensing apparatus further comprises:
   a first inverter having an input coupled to said reference match line;
   a second inverter having an input connected to an output of said first inverter; and
   a third inverter having an input coupled to said match line and an output coupled to both a pull up device and a pull down device;
   wherein, during said compare operation, said match line is latched to said match state by said pull up device if said output of said first inverter switches from a logic low voltage level to a logic high voltage level before said output of said third inverter switches from said logic low voltage level to said logic high voltage level; and
   said match line is latched to said mismatch state by said pull down device if said output of said third inverter switches from said logic low voltage level to said logic high voltage level before said output of said first inverter switches from said logic low voltage level to said logic high voltage level.

7. The CAM of claim 6, wherein:
   said match line is latched to said match state through a first PFET device coupled to a second PFET device, said first PFET device further coupled to said match line and said second PFET device further coupled to said logic high voltage level;
   wherein a gate of said first PFET device is coupled to an output of said second inverter and a gate of said second PFET device is coupled to said output of said third inverter.

8. The CAM of claim 6, wherein:
   said match line is latched to said mismatch state through a first NFET device coupled to a second NFET device, said first NFET device further coupled to said match line and said second NFET device further coupled to said logic low voltage level;
   wherein a gate of said first NFET device is coupled to an output of said first inverter and a gate of said second NFET device is coupled to said output of said third inverter.

9. The CAM of claim 1, wherein said CAM cells are adapted to correct any mismatching bits stored therein if said match line is latched to said match state.

10. The CAM of claim 9, wherein each of said CAM cells further comprise:
    a pair of cross coupled inverters configured as a data storage latch;
    a first access transistor which selectively couples a bit line to a first node within said data storage latch;
    a second access transistor which selectively couples a complementary bit line to a second node within said data storage latch, said first node having a voltage value representing the value of the bit stored in said data storage latch and said second node having a voltage value representing the complementary value of the bit stored in said data storage latch;
    a third access transistor which selectively couples said first node to said match line; and
    a fourth access transistor which selectively couples said second node to said match line.

11. The CAM of claim 10, wherein:
    if a comparand bit applied to a given CAM cell does not match a stored bit within said CAM cell, and if said match line is also latched to said match state, then said stored bit within said CAM cell is caused to be inverted.

12. The CAM of claim 11, further comprising means for preventing a matching stored bit within said CAM cell from being inverted by said match line if said match line is latched to said mismatch state.

13. The CAM of claim 12, wherein said means further comprises:
    a first diode, coupled between said third access transistor and said match line; and
    a second diode, coupled between said fourth access transistor and said match line.

14. The CAM of claim 13, wherein said first and second diodes further comprise a pair of NFETs, each having a gate and a source terminal coupled to said match line.

15. A content addressable memory (CAM), comprising:
    a plurality of individual CAM cells for storing a codeword, said codeword having a number of bits associated therewith;
    a match line coupled to each of said plurality of individual CAM cells, said match line used to indicate a match status of a comparand word that is compared to said stored codeword, wherein said match status is reflective of either a match state or a mismatch state; and
    a sensing apparatus for latching said match line to said match state whenever said comparand word mismatches said stored codeword by a number of N or fewer bits, and said sensing apparatus further latching said match line to said mismatch state whenever said comparand word mismatches said stored codeword by more than N bits, said sensing apparatus further comprising:
- a reference match line, said reference match line being discharged at a selected rate from a precharged state during a compare operation;
- wherein, during said compare operation, said sensing apparatus determines said match status by comparing said selected rate of discharge of said reference match line to a rate of discharge of said match line; and
- said CAM cells further being adapted to correct any mismatching bits stored therein if said match line is latched to said match state.

16. The CAM of claim 15, wherein N=1.

17. The CAM of claim 15, wherein:
if said selected rate of discharge of said reference match line is greater than said rate of discharge of said match line, then said match line is latched to said match state; and
if said rate of discharge of said match line is greater than said selected rate of discharge of said reference match line, then said match line is latched to said mismatch state.

18. The CAM of claim 17, wherein said sensing apparatus further comprises:
- a first inverter having an input coupled to said reference match line;
- a second inverter having an input connected to an output of said first inverter; and
- a third inverter having an input coupled to said match line and an output coupled to both a pull up device and a pull down device;
- wherein, during said compare operation, said match line is latched to said match state by said pull up device if said output of said first inverter switches from a logic low voltage level to a logic high voltage level before said output of said third inverter switches from said logic low voltage level to said logic high voltage level; and
- said match line is latched to said mismatch state by said pull down device if said output of said third inverter switches from said logic low voltage level to said logic high voltage level before said output of said first inverter switches from said logic low voltage level to said logic high voltage level.

19. The CAM of claim 18, wherein:
said match line is latched to said match state through a first PFET device coupled to a second PFET device, said first PFET de vice further coupled to said match line and said second PFET device further coupled to said logic high voltage level;
wherein a gate of said first PFET device is coupled to an output of said second inverter and a gate of said second PFET device is coupled to said output of said third inverter.

20. The CAM of claim 18, wherein:
said match line is latched to said mismatch state through a first NFET device coupled to a second NFET device, said first NFET device further coupled to said match line and said second NFET device further coupled to said logic low voltage level;
wherein a gate of said first NFET device is coupled to an output of said first inverter and a gate of said second NFET device is coupled to said output of said third inverter.

21. The CAM of claim 15, wherein each of said CAM cells further comprise:
- a pair of cross coupled inverters configured as a data storage latch;
- a first access transistor which selectively couples a bit line to a first node within said data storage latch;
- a second access transistor which selectively couples a complementary bit line to a second node within said data storage latch, said first node having a voltage value representing the value of the bit stored in said data storage latch and said second node having a voltage value representing the complementary value of the bit stored in said data storage latch;
- a third access transistor which selectively couples said first node to said match line; and
- a fourth access transistor which selectively couples said second node to said match line.

22. The CAM of claim 21, wherein:
if a comparand bit applied to a given CAM cell does not match a stored bit within said CAM cell, and if said match line is also latched to said match state, then said stored bit within said CAM cell is caused to be inverted.

23. The CAM of claim 22, further comprising means for preventing a matching stored bit within said CAM cell from being inverted by said match line if said match line is latched to said mismatch state.

24. The CAM of claim 23, wherein said means further comprises:
- a first diode, coupled between said third access transistor and said match line; and
- a second diode, coupled between said fourth access transistor and said match line.

25. The CAM of claim 24, wherein said first and second diodes further comprise a pair of NFETs, each having a gate and a source terminal coupled to said match line.

26. A method for detecting a soft error within a content addressable memory (CAM), the method comprising:
- configuring a plurality of individual CAM cells for storing a codeword having a number of bits associated therewith;
- coupling a match line to each of said Plurality of individual CAM cells, said match line used to indicate a match status of a comparand word that is compared to said stored codeword, wherein said match status is reflective of wither a match state or a mismatch state; and
- configuring a sensing apparatus for latching said match line to said match state whenever said comparand word mismatches said stored codeword by a number of N or fewer bits.

27. The method of claim 26, wherein N=1.

28. The method of claim 26, wherein:
said sensing apparatus further latches said match line to said mismatch state whenever said comparand word mismatches said stored codeword by more than N bits.

29. The method of claim 26, wherein said sensing apparatus further comprises:
- a reference match line, said reference match line being discharged at a selected rate from a precharged state during a compare operation;
- wherein, during said compare operation, said sensing apparatus determines said match status by comparing said selected rate of discharge of said reference match line to a rate of discharge of said match line.

30. The method of claim 29, wherein:
if said selected rate of discharge of said reference match line is greater than said rate of discharge of said match line, then said match line is latched to said match state; and if said rate of discharge of said match line is greater than said selected rate of discharge of said reference match line, then said match line is latched to said mismatch state.

31. The method of claim 30, wherein said sensing apparatus further comprises:
a first inverter having an input coupled to said reference match line;
a second inverter having an input connected to an output of said first inverter; and
a third inverter having an input coupled to said match line and an output coupled to both a pull up device and a pull down device;
wherein, during said compare operation, said match line is latched to said match state by said pull up device if said output of said first inverter switches from a logic low voltage level to a logic high voltage level before said output of said third inverter switches from said logic low voltage level to said logic high voltage level; and
said match line is latched to said mismatch state by said pull down device if said output of said third inverter switches from said logic low voltage level to said logic high voltage level before said output of said first inverter switches; from said logic low voltage level to said logic high voltage level.

32. The method of claim 31, wherein:
said match line is latched to said match state through a first PFET device coupled to a second PFET device, said first PFET device further coupled to said match line and said second PFET device further coupled to said logic high voltage level;
wherein a gate of said first PFET device is coupled to an output of said second inverter and a gate of said second PFET device is coupled to said output of said third inverter.

33. The method of claim 31, wherein:
said match line is latched to said mismatch state through a first NFET device coupled to a second NFET device, said first NFET device further coupled to said match line and said second NFET device further coupled to said logic low voltage level;
wherein a gate of said first NFET device is coupled to an output of said first inverter and a gate of said second NFET device is coupled to said output of said third inverter.

34. A method for detecting and correcting a soft error within a content addressable memory (CAM), the method comprising:
configuring a plurality of individual CAM cells for storing a codeword having a number of bits associated therewith;
coupling a match line to each of said plurality of individual CAM cells, said match line used to indicate a match status of a comparand word that is compared to said stored codeword, wherein said match status is reflective of either a match state or a mismatch state;
configuring a sensing apparatus for latching said match line to said match state whenever said comparand word mismatches said stored codeword by a number of N or fewer bits; and adapting said CAM cells are adapted to correct any mismatching bits stored therein if said match line is latched to said match state.

35. The method of claim 34, wherein each of said CAM cells further comprise:
a pair of cross coupled inverters configured as a data storage latch;
a first access transistor which selectively couples a bit line to a first node within said data storage latch;
a second access transistor which selectively couples a complementary bit line to a second node within said data storage latch, said first node having a voltage value representing the value of the bit stored in said data storage latch and said second node having a voltage value representing the complementary value of the bit stored in said data storage latch;
a third access transistor which selectively couples said first node to said match line; and
a fourth access transistor which selectively couples said second node to said match line.

36. The method of claim 35, wherein:
if a comparand bit applied to a given CAM cell does not match a stored bit within said CAM cell, and if said match line is also latched to said match state, then said stored bit within said CAM cell is caused to be inverted.

37. The method of claim 36, further comprising:
configuring means for preventing a matching stored bit within said CAM cell from being inverted by said match line if said match line is latched to said mismatch state.

38. The method of claim 37, wherein said means further comprises:
a first diode, coupled between said third access transistor and said match line; and
a second diode, coupled between said fourth access transistor and said match line.

39. The method of claim 38, wherein said first and second diodes further comprise a pair of NFETs, each having a gate and a source terminal coupled to said match line.

40. A method for detecting and correcting soft error within a content addressable memory (CAM), the method comprising:
comparing a rate of discharge of a precharged match line included within the CAM with a rate of discharge of a precharged reference match line included within the CAM, said match line being coupled to a plurality of CAM cells within the CAM;
determining, based on said rate of discharge of said reference match line and said rate of discharge of said match line, whether there exists either a match state or a mismatch state;
said match state being defined by a mismatch of a N or fewer bits between a stored codeword and a comparand word applied to the CAM;
said mismatch state being defined by i mismatch of N+1 or more bits between said stored codeword and said comparand word; and
inverting any mismatching bits within said stored codeword if a match state exists.

41. The method of claim 40, wherein N=1.

42. The method of claim 40, wherein:

said rate of discharge of said reference match line is a fixed discharge rate;

said fixed discharge rate of said reference match line is greater than said discharge rate of said match line under conditions of an N bit or less mismatch between said stored codeword and said comparand word; and said fixed discharge rate of said reference match line is less than said discharge rate of said match line under conditions of an N+1 bit or more mismatch between said stored codeword and said comparand word.

43. The method of claim 42, further comprising:

preventing any matching bits within said stored codeword from being inverted if a mismatch state exists.

44. The method of claim 43, wherein:

if a match state exists, then said match line is caused to be latched to a first voltage value; and if a mismatch state exists, then said match line is caused to be latched to a second voltage value.

* * * * *